US012500151B2

(12) United States Patent
Maldo et al.

(10) Patent No.: US 12,500,151 B2
(45) Date of Patent: Dec. 16, 2025

(54) SOLDERLESS AND PRESSURE CONTACT CONNECTION

(71) Applicant: Littelfuse, Inc., Chicago, IL (US)

(72) Inventors: Tiburcio A Maldo, Cebu (PH); Rhodri Hughes, Swindon (GB); Robert Ebido, Batangas (PH); Jeff Grozen, Muntinlupa (PH); Josef Colquin A. Chua, Batangas (PH); Domingo Atienza, Jr., Batangas (PH)

(73) Assignee: Littelfuse, Inc., Rosemont, IL (US)

( * ) Notice: Subject to any disclaimer, the term of this patent is extended or adjusted under 35 U.S.C. 154(b) by 628 days.

(21) Appl. No.: 17/862,692

(22) Filed: Jul. 12, 2022

(65) Prior Publication Data

US 2024/0021505 A1 Jan. 18, 2024

(51) Int. Cl.

*H01L 23/498* (2006.01)
*H01L 21/48* (2006.01)
*H01L 23/00* (2006.01)

(52) U.S. Cl.

CPC .. *H01L 23/49811* (2013.01); *H01L 23/49838* (2013.01); *H01L 21/4853* (2013.01); *H01L 24/32* (2013.01); *H01L 2224/32225* (2013.01)

(58) Field of Classification Search

CPC ......... H01L 23/49811; H01L 23/49551; H01R 12/585

See application file for complete search history.

(56) References Cited

U.S. PATENT DOCUMENTS

| | | | | |
|---|---|---|---|---|
| 5,544,412 | A | 8/1996 | Romero | |
| 2007/0205501 | A1 | 9/2007 | Lee | |
| 2012/0115339 | A1* | 5/2012 | Schaarschmidt | H01R 12/585 29/874 |
| 2013/0082387 | A1 | 4/2013 | Stolze | |
| 2015/0364847 | A1 | 12/2015 | Yao | |
| 2022/0157672 | A1 | 5/2022 | Takahashi | |
| 2023/0369277 | A1* | 11/2023 | Seddon | H01L 23/49811 |

FOREIGN PATENT DOCUMENTS

| | | | |
|---|---|---|---|
| CN | 108780786 | A | 11/2018 |
| CN | 113574668 | A | 10/2021 |
| EP | 3584829 | A1 | 12/2019 |
| JP | 2004047800 | A | 2/2004 |
| JP | 2008140788 | A | 6/2008 |
| TW | 200824083 | A | 6/2008 |

OTHER PUBLICATIONS

European Search Report for EP Application No. 23182821.1, dated Nov. 28, 2023, 15 pages.
European Search Report for EP Application No. 23182772.6, dated Dec. 11, 2023, 4 pages.
European Search Report for EP Application No. 23182821.1, dated Feb. 19, 2024, 13 pages.

* cited by examiner

*Primary Examiner* — Michele Fan
(74) *Attorney, Agent, or Firm* — KDW Firm PLLC

(57) ABSTRACT

A pressure contact assembly includes a power substrate, a chip, and a lead. The power substrate has a surface connected to a ceramic tile and a cavity. The chip is soldered to the surface. The lead is to be inserted into the cavity and has a top portion to connect to an external device and a bottom portion to fit into the cavity.

8 Claims, 12 Drawing Sheets

400

400

700

700

SOLDERLESS AND PRESSURE CONTACT CONNECTION

FIELD OF THE DISCLOSURE

Embodiments of the present disclosure relate to direct copper bonded (DCB) and active metal brazed (AMB) substrates and, more particularly, to soldering issues for these substrates.

BACKGROUND

Substrates for power electronics are different than printed circuit boards used for low power microelectronics. The power electronics substrate both provides the interconnections to form an electrical circuit and cool the components. Power electronic substrates carry higher currents and provide a higher voltage isolation (up to several thousand volts), as compared to microelectronic counterparts, and operate over a wide temperature range (e.g., up to 200° C.).

Direct bonded copper (DBC), also known as direct copper bonded (DCB) substrates, have very good thermal conductivity, and are thus suitable for power modules. DCBs are composed of a ceramic tile with a sheet of copper bonded to one or both sides of the ceramic tile. Suitable for smaller lots, active metal brazed (AMB) substrates involve the attachment of thick metal layers to ceramic plates. Insulated metal substrates (IMS) are also used for power modules and consist of a metal baseplate covered by a thin layer of dielectric and a layer of copper. IMS are single-sided substrates.

When bonding a power electronics substrate to a power lead, there may exist system reliability issues with the soldering. A phenomenon known as "cold solder" can compromise the bond between the power lead and the substrate over time, particularly when the power electronics substrate is operating in a harsh environment.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a pressure contact assembly in accordance with the present disclosure may include a power substrate, a chip, and a lead. The power substrate has a surface connected to a ceramic tile and a cavity. The chip is soldered to the surface. The lead is to be inserted into the cavity and has a top portion to connect to an external device and a bottom portion to fit into the cavity.

Another exemplary embodiment of a pressure contact assembly in accordance with the present disclosure may include a lead and a power substrate. The lead has a first portion and a second portion connected to the first portion. The first portion connects to an external device. The second portion is perpendicular to the first portion and has a modification to its smooth surface. The power substrate has a first surface connected to a ceramic tile. The first surface has a cavity inside which the modification is press-fit.

DETAILED DESCRIPTION

Several embodiments of pressure contact assemblies are disclosed herein. The pressure contact assemblies each feature a power substrate having a ceramic tile sandwiched between two DCB or AMB surfaces or a power substrate having a ceramic tile disposed atop an insulated metal substrate. The power substrate has one or more cavities etched out of the top surface and may feature both over-etches and under-etches, where the under-etches may be half-etches, in some embodiments. The power lead (terminal) is adapted to have a top portion that is much like prior art leads, whereas the bottom portion is modified to be fit into the one or more cavities in a variety of ways. Modifications are made to the ceramic tile to improve the ability of the power substrates to support pressure contact assembly.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

As used herein, power substrates refer variously to direct bonded copper (DBC), also known as direct copper bonded (DCB) substrates, active metal brazed (AMB) substrates, and insulated metal substrates (IMS). The principles shown and described herein may refer to any of these types of substrates. For simplicity, these substrates are referred to as power substrates.

Figure 1A:
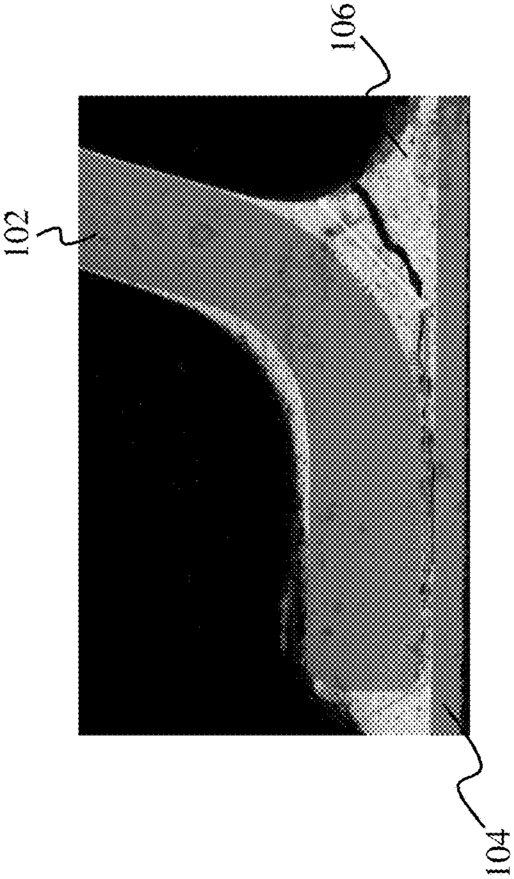
FIGS. 1A-1B are diagrams illustrating the cold solder phenomenon, in accordance with the prior art.
Figure 1B:
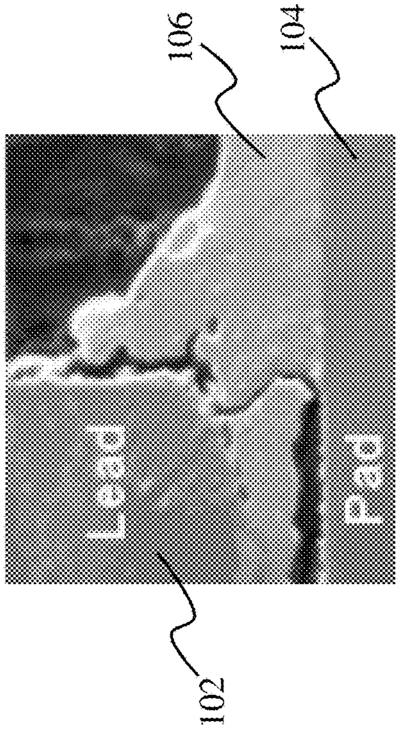

FIGS. 1A-1B are representative drawings of a cold solder problem experienced with power substrates, according to the prior art. FIG. 1A shows a lead (terminal) 102 partially surrounded by solder 106, where the solder 106 attaches the lead to a pad 104 of a power substrate. FIG. 1B is a close-up view of the lead 102, solder 106, and pad 104. In both illustrations, cracks have formed in the solder 106, a phenomenon known as cold solder. Cold solder occurs when the solder cracks, which may occur over time, and is more likely to occur in harsh environments. If the cracks become large enough, the lead 102 is no longer able to form an electrical connection with the pad 104. Thus, the solder 106 is no longer functioning as intended, causing the electronic circuit to become unreliable.

Figure 2:
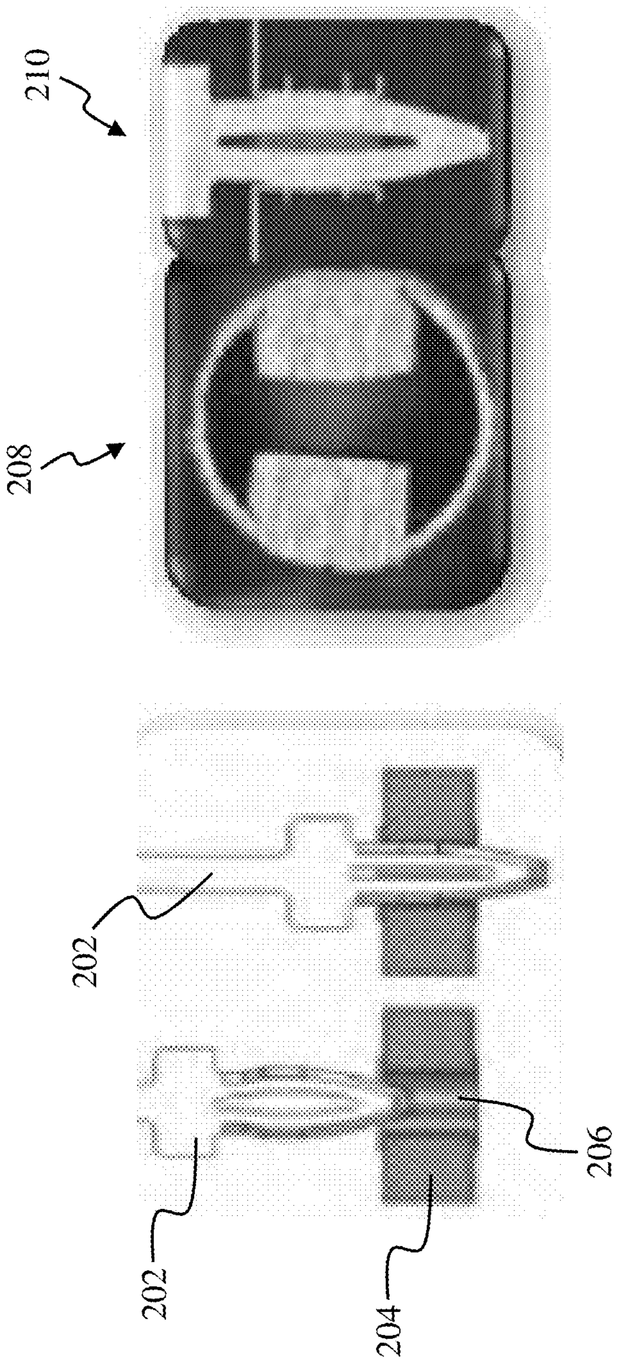
FIG. 2 is a diagram illustrating a press-fit solution for bonding components to a printed circuit board, in accordance with the prior art.

FIG. 2 is a representative drawing of a press-fit solution used to replace soldering in printed circuit boards (PCBs), according to the prior art. A lead (terminal) 202 is shaped to fit securely into an aperture 206 of a PCB 204. The lead 202 is slender at one end, the end to be inserted into the aperture 206, but more bulbous at a center portion, where the diameter of the more bulbous portion is slightly larger than the diameter of the aperture 206. Once the lead 202 is press-fit into the aperture 206 of the PCB 204, the bulbous portion partially compresses in the aperture, forming a tight fit in the PCB 204. A top view 208 and a side view 210 are also shown.

Though there are variations, PCBs are typically made using a material known as FR4 (fire-retardant 4), which is a composite material consisting of woven fiberglass cloth combined with an epoxy resin binder. PCBs thus have some flexibility, which makes them suitable for press-fitting leads through their structure. Power substrates, on the other hand, are made using metal and ceramic, which are less flexible materials. Adding via holes in a power substrate is doable and the press fit pin can be inserted into the via holes. However, the components on the power substrate will lose the electrical isolation that characterizes power substrates, thus defeating the purpose of using power substrates. The traditional press-fitting illustrated in FIG. 2 is thus not suitable for power substrates.

Figure 3A:
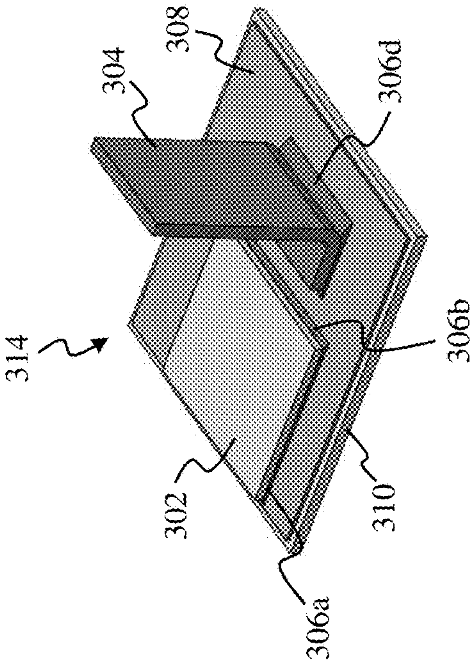
FIGS. 3A-3B are diagrams illustrating soldering of components to a power substrate, in accordance with the prior art.
Figure 3B:
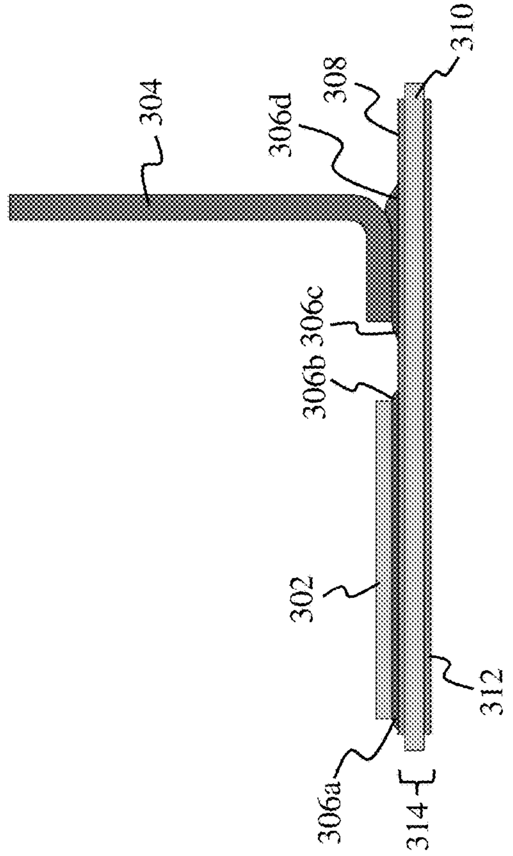

FIGS. 3A-3B are representative drawings showing soldering on power substrates, according to the prior art. FIG. 3A is a perspective view and FIG. 3B is a side view of a power substrate 314. The power substrate 314 consists of a first surface 308 and a second surface 312, with a ceramic tile 310 sandwiched therebetween. The power substrate 314 may thus be a DCB substrate, with the first surface 308 and second surface 312 being direct copper bonded material. Or the power substrate 314 may be an AMB substrate, with the first surface 308 and the second surface 312 being active metal brazed material. Disposed on the power substrate 314 is a power chip 302 (hereinafter, "chip 302") and a power lead (terminal) 304 (hereinafter, "lead 304"), which are attached to the power substrate 314 using solder. Solder 306*a* and 306*b* are used to attach the chip 302 to the power substrate 314 while solder 306*c* and 306*d* are used to attach the lead 304 to the power substrate 314 (collectively, "solder 306"). The solders 306*a-d* may be regular solders, high-lead solders, lead-free solders, such as Ag-sintered, and so on. Or the solder 306*a* and 306*b* may be one type of solder while the solder 306*c* and 306*d* is a second type. Where the solders 306 are the same, the chip 302 and the lead 304 may be advantageously attached to the power substrate 314 in one process.

The solders 306*c* and 306*d* used to attach the lead 304 to the power substrate 314 may experience cold solder over time and in the presence of unfavorable environmental conditions. Where there is generally minimal thermo-mechanical stress on the chip 302, there may be significantly more thermo-mechanical stress on the lead 304, partly because the lead 304 is connected to an external circuit which might induce mechanical stress. Further, because both ends of the lead 304 are fixed, one side to the power substrate 314 and the other side to the external circuit, the lead 304 may experience higher thermo-mechanical stress during expansion and contraction which may occur over time. Thus, solder 306*a* and 306*b* on the chip 302 typically does not get stressed as much as solder 306*c* and 306*d* on the lead 304. The result may be an unreliable connection between the lead 304 and the power substrate 314. Since the lead 304 is connected to an external device, such as a busbar, other terminal, or PCB, the failure of the solders 306*c* or 306*d* will isolate the chip 302 from the rest of the circuitry and prevent it from functioning.

Figure 4A:
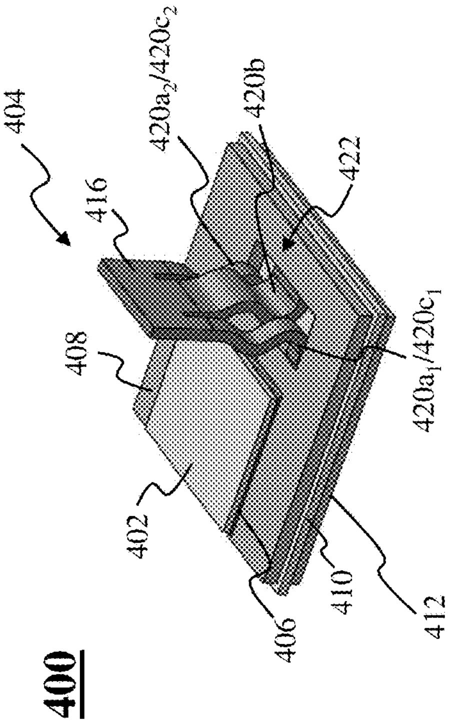
FIGS. 4A-4D are diagrams illustrating a pressure contact assembly, in accordance with exemplary embodiments.
Figure 4B:
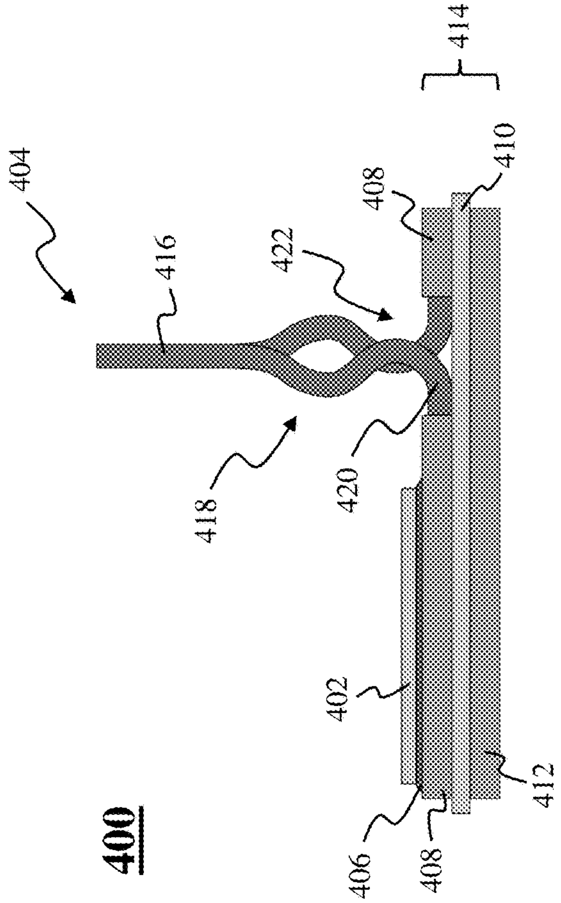
Figure 4D:
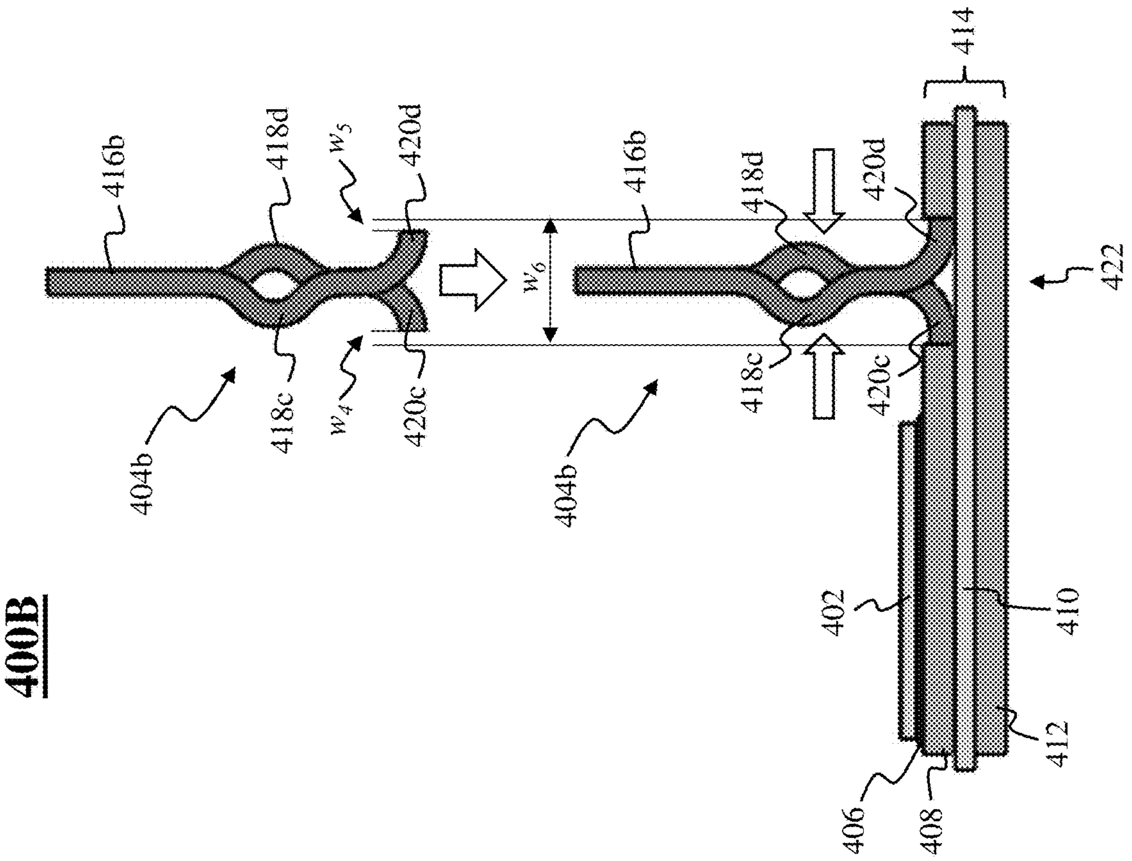
Figure 4C:
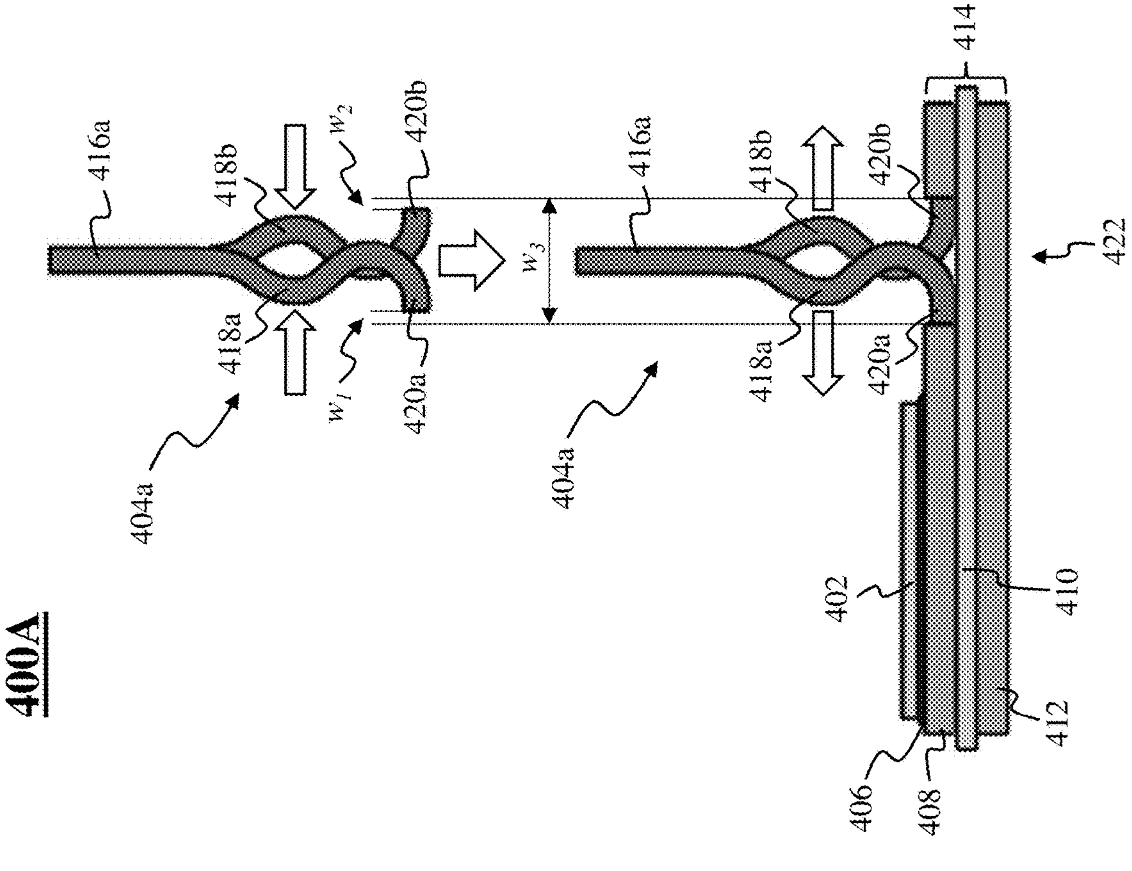

FIGS. 4A-4D are representative drawings of a pressure contact assembly 400, according to exemplary embodiments. FIG. 4A is a perspective view, FIG. 4B is a side view, and FIGS. 4C-4D are detailed side views of two different embodiments of the pressure contact assembly 400. The power substrate 414 consists of a first surface 408 and a second surface 412, with a ceramic tile 410 sandwiched therebetween. The power substrate 414 may thus be a DCB or an AMB substrate. In a non-limiting example, the pressure contact assembly 400 may alternatively be a single-sided power substrate 414, such as IMS. Disposed on the power substrate 414 is a power chip 402 (hereinafter, "chip 402") and a power lead (terminal) 404 (hereinafter, "lead 404"), which are attached to the power substrate 414 using solder 406. Alternatively, the chip 402 may be attached to the power substrate 414 using Ag sintering.

The pressure contact assembly 400 utilizes 1) a cavity 422 formed in the power substrate 414; 2) a modification to the lead 404 to fit into the cavity 422; and optionally, 3) a modification to the ceramic tile 410 to facilitate successful connection between the lead 404 and the power substrate 414. The cavity 422 may be formed in a variety of ways known to those of skill in the art. In exemplary embodiments, the cavity 422 is formed by etching or otherwise cutting away the first surface 408 of the power substrate 414, exposing the ceramic tile 410 at the cavity 422. Alternatively, the first surface 408 may be partially etched away such that the ceramic tile 410 is not exposed at the cavity 422. In either case, the cavity 422 has sufficient depth to accommodate the base of the lead 404, as described further below.

In exemplary embodiments, the lead 404 consists of a top portion 416 and a bottom portion 420 in which the top portion 416 is split into two opposing sections. The bottom portion 420 further includes a pressure portion 418. FIGS. 4C-4D illustrate alternative pressure contact assemblies 400A and 400B, respectively (collectively, "pressure contact assembly 400" or "pressure contact assemblies 400"). Lead 404*a* consists of top portion 416*a* and bottom portions 420*a* and 420*b*, which include pressure portions 418*a* and 418*b*, respectively; lead 404*b* consists of top portion 416*b* and bottom portions 420*c* and 420*d*, which include pressure portions 418*c* and 418*d*, respectively (collectively, "top portion(s) 416", "pressure portion(s) 418", and "bottom portion(s) 420"). The top portion 416 looks like the top of lead 304. Thus, connecting the lead 404 to external circuitry is not impacted by the design change over the prior art.

The bottom portions 420 are curved like ribbon candy (with multiple waves) and are oppositional to one another (like mirror image S structures). Looking at the pressure contact assembly 400A (FIG. 4C), for example, bottom portion 420*a* extends downward from top portion 416*a*, curves to the left, curves to the right, then curves again to the left until being disposed horizontally (perpendicular to top portion 416*a*); bottom portion 420*b* also extends downward from top portion 416*a*, curves to the right, curves to the left, then curves again to the right until being disposed horizontally (perpendicular to top portion 416*a*). In exemplary embodiments, the top portion 416 is split into two different bottom portions 420$a$ and 420$b$, with bottom portion 420$a$ having two distinct parts, 420$a_1$ and 420$a_2$, as illustrated in FIG. 4A, where bottom portion 420$b$ occupies the center of the lead 404, and bottom portions 420$a_1$ and 420$a_2$ are disposed on either side of bottom portion 420$b$. In FIGS. 4B-4D, bottom portion 420$a_2$ is not visible, being "behind" the other bottom portions 420$a_1$ and 420$b$. Thus, for both the pressure contact assemblies 400A and 400B, the top portion 416 of the lead 404 is split into a first s-shaped section 416$a_1$/416$c_1$, a second s-shaped section 416$b$, and a third s-shaped section 416$a_2$/416$c_2$, where the second s-shaped section 416$b$ is disposed between the first s-shaped section 416$a_1$/416$c_1$ and the third s-shaped section 416$a_2$/416$c_2$, and the second s-shaped section 416$b$ is a mirror image of the first s-shaped section 416$a_1$/416$c_1$ and the third s-shaped section 416$a_2$/416$c_2$.

The result of this design is a lead 404$a$ that has movement in the form of spring action. In exemplary embodiments, by pushing the bottom portions 420$a$ and 420$b$ toward one another at pressure portions 418$a$ and 418$b$, respectively, this causes bottom portions 420$a$ and 420$b$ to move toward one another. The lead 404$a$ thus has a resting state (bottom of FIG. 4C) and a compressed state (top of FIG. 4C). Bottom portion 420$a$ can move a width, $w_1$, in a leftward direction while bottom portion 420$b$ is able to move a width, $w_2$, in a rightward direction, where widths $w_1$ and $w_2$ may be equal ($w_1=w_2$) or not equal ($w_1 \neq w_2$). Cavity 422 has a width, $w_3$. In the resting state of lead 404$a$, the distal ends of bottom portions 420$a$ and 420$b$ are a width, $w_3$, apart while, in the compressed state of lead 404$a$, bottom portions 420$a$ and 420$b$ are a width, $w_3-(w_1+w_2)$ apart.

To attach the lead 404$a$ to the power substrate 414, the pressure portions 418$a$ and 418$b$ are pressed toward one another, causing the lead 404$a$ to be in its compressed state. The lead 404 is then moved downward toward the cavity 422 until the bottom portions 420$a$ and 420$b$ touch the bottom of the cavity 422. The pressure portions 418$a$ and 418$b$ are then released so that they spring back until the lead 404 is in its resting state. In exemplary embodiments, horizontal pressure is applied to the pressure portions 418$a$ and 418$b$ to make a solderless contact between bottom portions 420$a$ and 420$b$ and to the wall of cavity 422, ensuring a tight coupling therebetween without need of solder. The lead 404 is thus fastened to the power substrate 414.

The pressure contact assembly 400B (FIG. 4D) is slightly different than the pressure contact assembly 400A. Bottom portion 420$c$ extends downward from top portion 416$b$ and curves to the right, then curves slightly to the left, extends vertically downward, then curves to the left in a horizontal disposition; bottom portion 420$d$ also extends downward from top portion 416$b$ and curves to the left, then curves slightly to the right, extends vertically downward, then curves to the right in a horizontal disposition. In exemplary embodiments, the top portion 416$b$ is split into bottom portions 420$c$ and 420$d$, with bottom portion 420$c$ having two distinct parts, 420$c_1$ and 420$c_2$, as illustrated in FIG. 4A, where bottom portions 420$c_1$ and 420$c_2$ are disposed on either side of bottom portion 420$b$. In FIGS. 4B-4D, bottom portion 420$c_2$ is not visible, being "behind" the other bottom portions 420$c_1$ and 420$b$. The base of bottom portions 420$c$ and 420$d$ are thus orthogonal to the top portion 416$b$.

Like lead 404$a$, lead 404$b$ has movement in the form of spring action. In exemplary embodiments, by pushing the pressure portions 418$c$ and 418$d$ toward one another, this causes bottom portions 420$c$ and 420$d$ to move away from one another. The lead 404$b$ thus has a resting state (top of FIG. 4D) and an expanded state (bottom of FIG. 4D). Bottom portion 420$c$ can move a width, $w_4$, in a leftward direction while bottom portion 420$d$ is able to move a width, $w_5$, in a rightward direction, where widths $w_4$ and $w_5$ may be equal ($w_4=w_5$) or not equal ($w_4 \neq w_5$). Cavity 422 has a width, $w_6$. In the resting state of lead 404$b$, the distal ends of bottom portions 420$c$ and 420$d$ are a width, $w_6-(w_4+w_5)$ apart while, in the expanded state of lead 404$b$, bottom portions 420$c$ and 420$d$ are a width, $w_6$ apart.

To attach the lead 404$b$ to the power substrate 414, the lead 404$b$ is first moved downward until the bottom portions 420$c$ and 420$d$ are inside the cavity 422. Pressure portions 418$c$ and 418$d$ are pressed toward one another, causing the bottom portions 420$c$ and 420$d$ to move and remain apart (the expanded state). In exemplary embodiments, horizontal pressure is applied to the pressure portions 418$c$ and 418$d$ to make a solderless contact between bottom portions 420$c$ and 420$d$ and to the wall of the cavity 422, ensuring a tight coupling therebetween without need of solder.

Figure 5A:
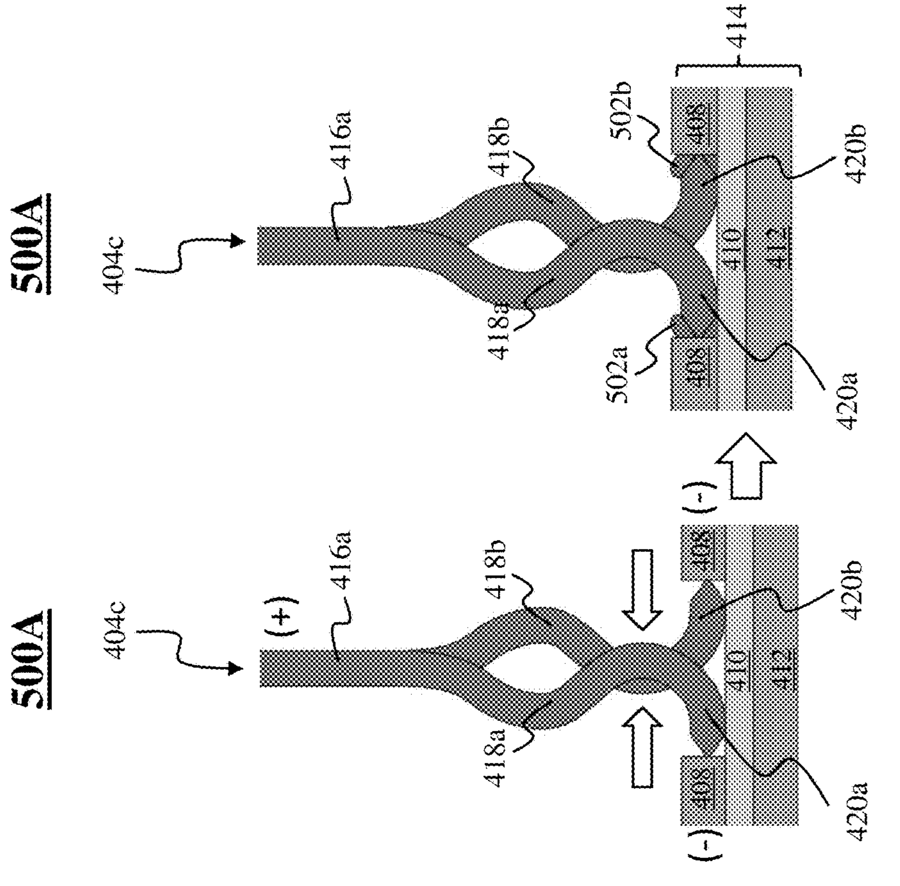
FIGS. 5A-5B are diagrams illustrating resistance welding used with the pressure contact assembly of FIGS. 4A-4D, in accordance with exemplary embodiments.
Figure 5B:
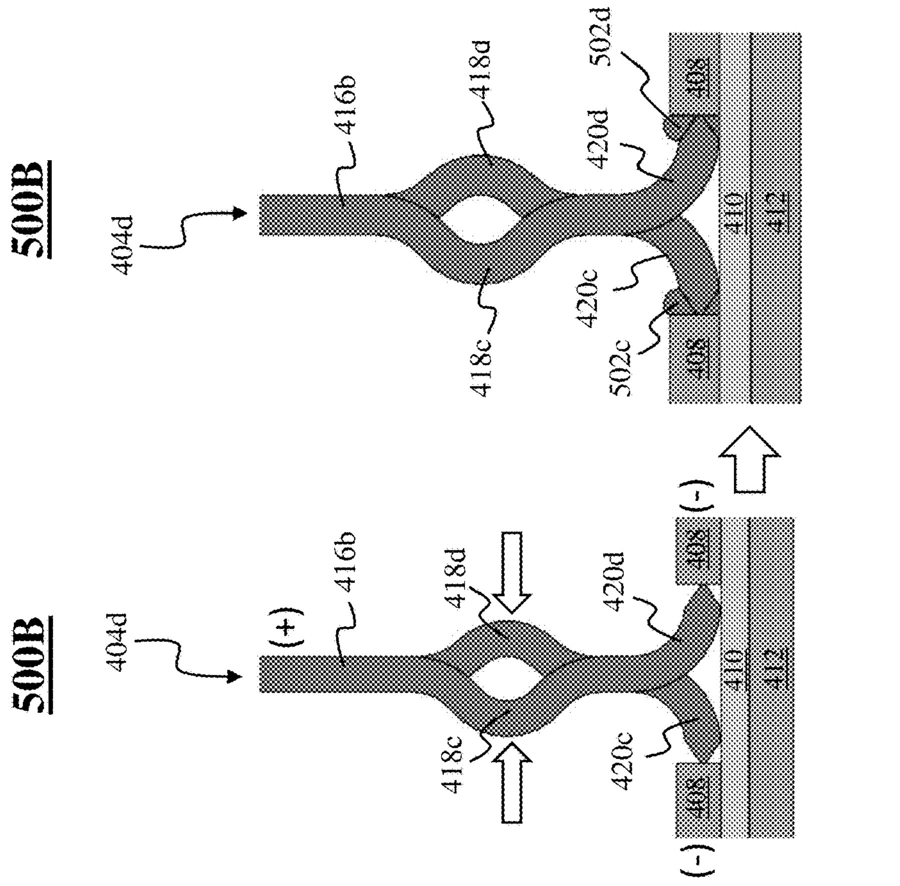

FIGS. 5A-5B are representative drawings of pressure contact assemblies 500A and 500B, according to exemplary embodiments. FIG. 5A presents side views of pressure contact assembly 500A while FIG. 5B presents side views of pressure contact assembly 500B. Pressure contact assembly 500A is the pressure contact assembly 400A, modified to include resistance welding; pressure contact assembly 500B is the pressure contact assembly 400B, modified to include resistance welding (collectively, "pressure contact assembly 500" or "pressure contact assemblies 500"). Join terminals 502$a$ and 502$b$ are shown in FIG. 5A while join terminals 502$c$ and 502$d$ are shown in FIG. 5B (collectively, "join terminal(s) 502"). In exemplary embodiments, resistance welding is performed at the join terminals 502, causing the bottom portions 420 of the respective leads 404 to soften/melt. Resistance welding is the joining of metals by applying pressure and passing current through the metal area to be joined. No additional materials such as solder, are needed to melt the bottom portions 420 against the first surface 408 of the power substrate 414. Resistance welding is done at high current (typically, greater than 110 A) with lower voltage (typically, 4-12 V) in which the two-input terminal either (+) or (−) can be at any position.

The following pressure contact assemblies are characterized as having L-shaped power leads (terminals) in which the top portion is for connection to an external device. The bottom portion, which is perpendicular to the top portion, includes one or more modifications from being an otherwise smooth surface. The one or more modified portions of the lead are press-fit into the power substrate. The surfaces of each power substrate have likewise been over-etched, under-etched, and/or half-etched to receive the modified portions of the lead. In some cases, additional pressure devices, such as part of the housing of the pressure contact assembly, are used to facilitate the press-fitting operation.

Figure 6B:
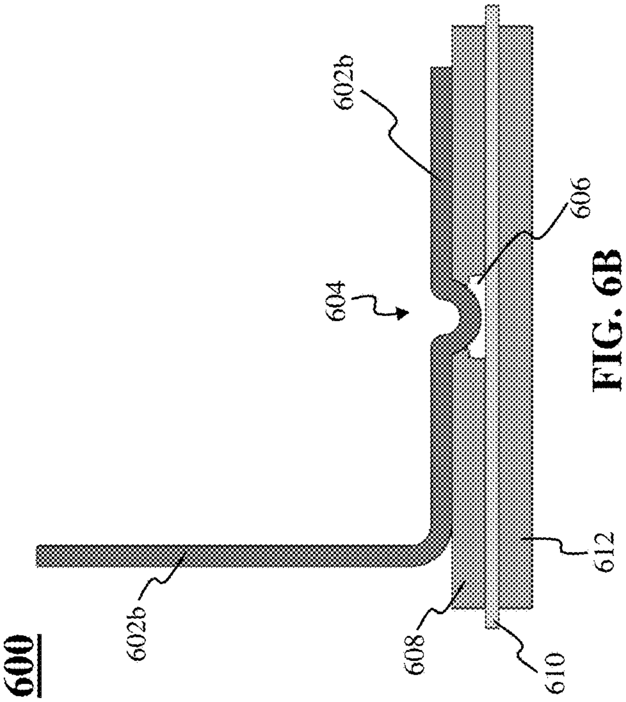
FIGS. 6A-6C are diagrams of a pressure contact assembly, in accordance with exemplary embodiments.
Figure 6A:
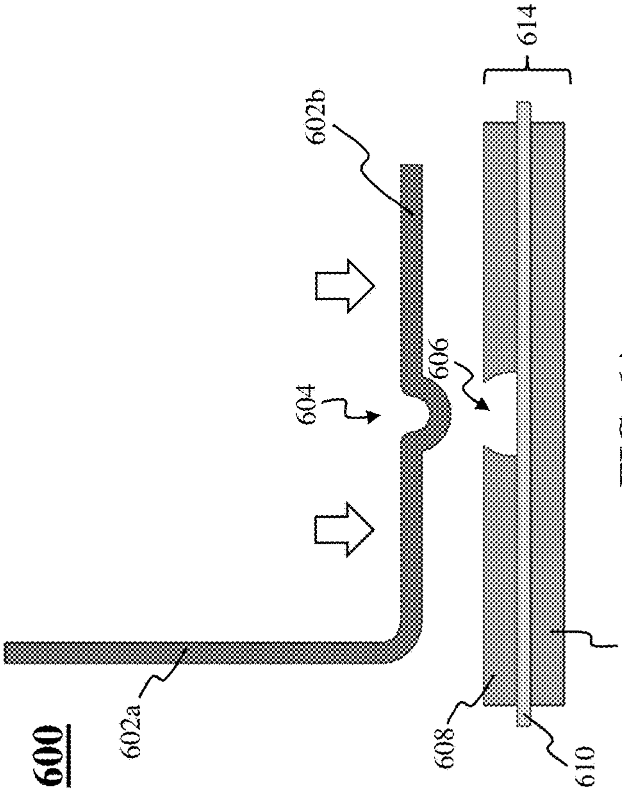
Figure 6C:
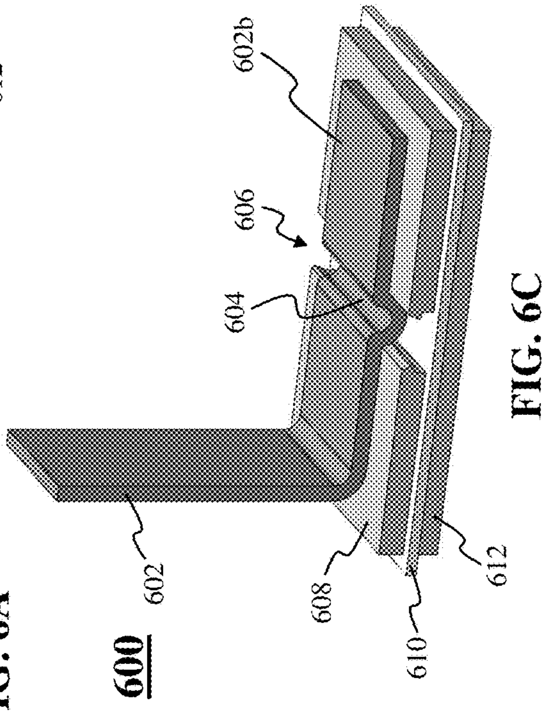

FIGS. 6A-6C are representative drawings of a pressure contact assembly 600, according to exemplary embodiments. FIGS. 6A-6B are side views and FIG. 6C is a perspective view of the pressure contact assembly 600. In exemplary embodiments, a power lead (terminal) has two portions 602$a$ and 602$b$ (collectively, "lead(s) 602"), with lead portion 602$a$ being orthogonal to lead portion 602$b$, forming an "L shape". The lead 602 is to be attached to a power substrate 614 consisting of a first surface 608 and a second surface 612, with a ceramic tile 610 sandwiched therebetween. Once attached, lead portion 602$a$ is orthogonal to the power substrate 614 while lead portion 602$b$ is adjacent the power substrate 614. In exemplary embodiments, the modification to the otherwise smooth surface of the lead portion 602*b* is a coining u-shape 604 for attachment to the power substrate 614.

Additionally, in exemplary embodiments, an over-etch 606 is cut into the power substrate 614, specifically, the first surface 608. The over-etch 606 is defined herein as a cut through the first surface 608 until the ceramic tile 610 is visible. Further, the over-etch 606 is wider at the bottom than at the top of the first surface 608. In exemplary embodiments, the lead 602 is placed over the power substrate 614 until the coining u-shape 604 is disposed over the over-etch 606. Pressure is applied to the lead portion 602*b* until the coining u-shape 604 fits into the over-etch 606. Alternatively, the coining u-shape 604 may be slid into the over-etch 606, from the back of the power substrate 614 or from the front. The first surface 608 will deform somewhat around the coining u-shape 604, causing the lead 602 to be permanently attached to the power substrate 614 without using solder. The lead 602 is thus fastened to the power substrate 614.

Figure 7B:
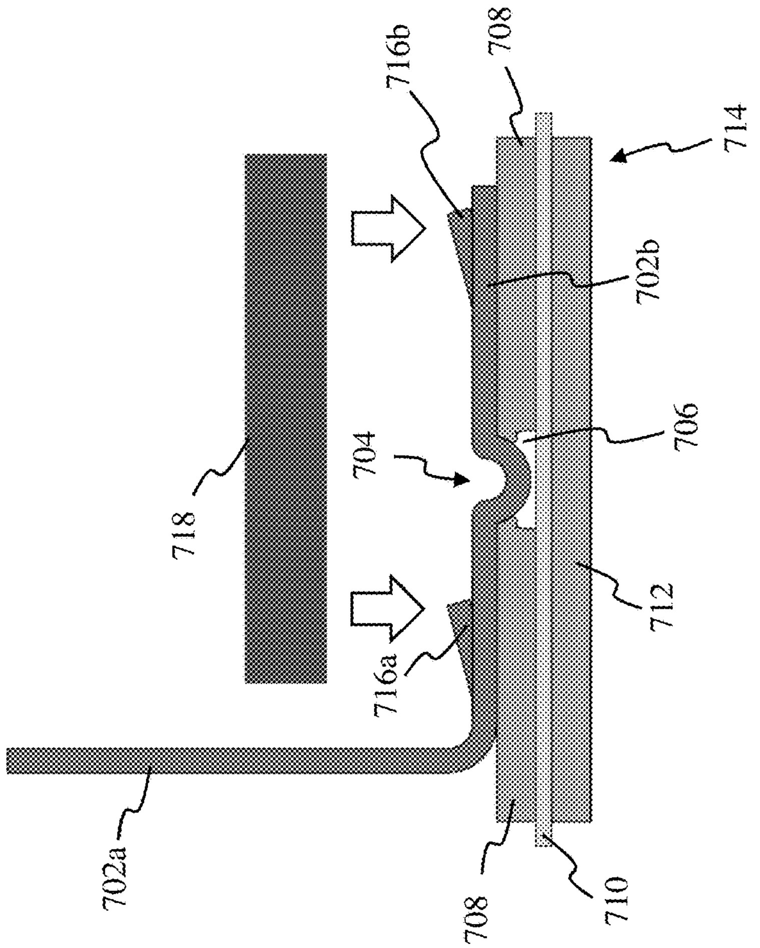
FIGS. 7A-7B are diagrams of a pressure contact assembly, in accordance with exemplary embodiments.
Figure 7A:
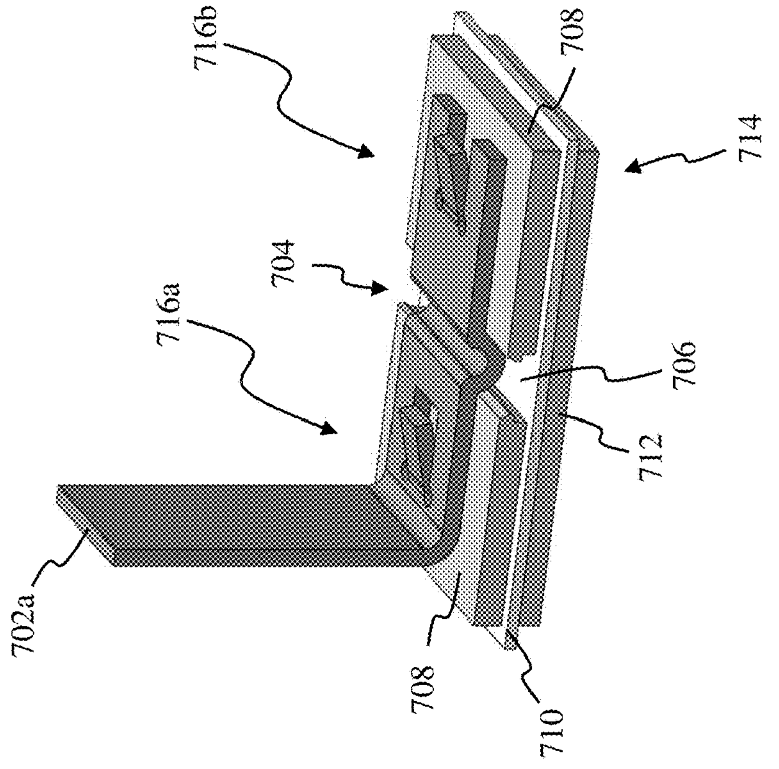

FIGS. 7A-7B are representative drawings of a pressure contact assembly 700, according to exemplary embodiments. FIG. 7A is a perspective view and FIG. 7B is a side view of the pressure contact assembly 700. Like the pressure contact assembly 600, the pressure contact assembly 700 features a power lead (terminal) having two portions 702*a* and 702*b* (collectively, "lead(s) 702"), with lead portion 702*a* being orthogonal to lead portion 702*b*, forming an "L shape". The lead 702 is to be attached to a power substrate 714 consisting of a first surface 708 and a second surface 712, with a ceramic tile 710 sandwiched therebetween. In exemplary embodiments, the modification to the otherwise smooth surface of the lead portion 602*b* is also a coining u-shape 704 for attachment to the power substrate 714. An over-etch 706 is cut into the power substrate 714 until the ceramic tile 710 is visible.

In exemplary embodiments, lead portion 702*b* further includes spring contacts 716*a* and 716*b* (collectively, "spring contact(s) 716"). The spring contacts 716 are sections of the lead portion 702*b* that have been cut, then bent upward. In a non-limiting example, the cutout sections are generally rectangular in shape, forming the spring contacts 716. In exemplary embodiments, housing 718 of the pressure contact assembly 700 pushes against the spring contacts 716, thus providing constant pressure to the lead 702, without need of solder. The lead 702 is thus fastened to the power substrate 714.

Figure 8B:
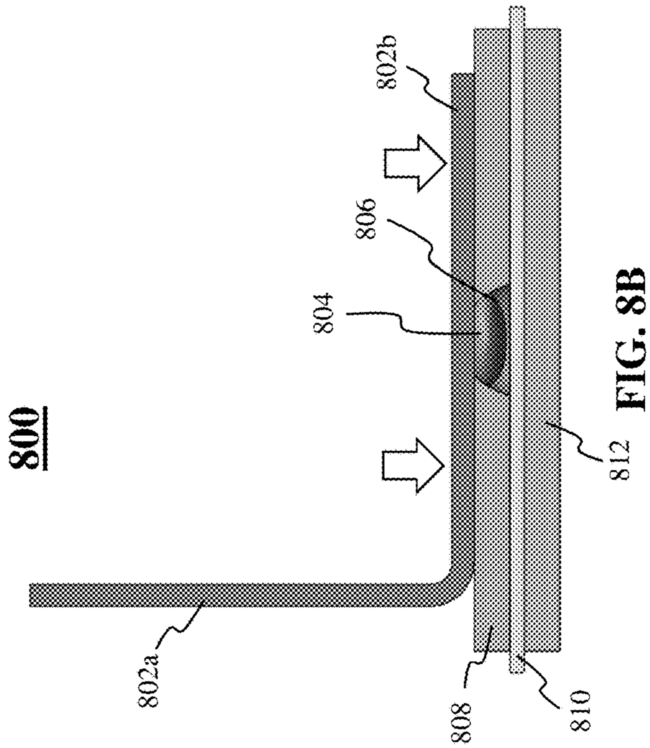
FIGS. 8A-8C are diagrams of a pressure contact assembly, in accordance with exemplary embodiments.
Figure 8A:
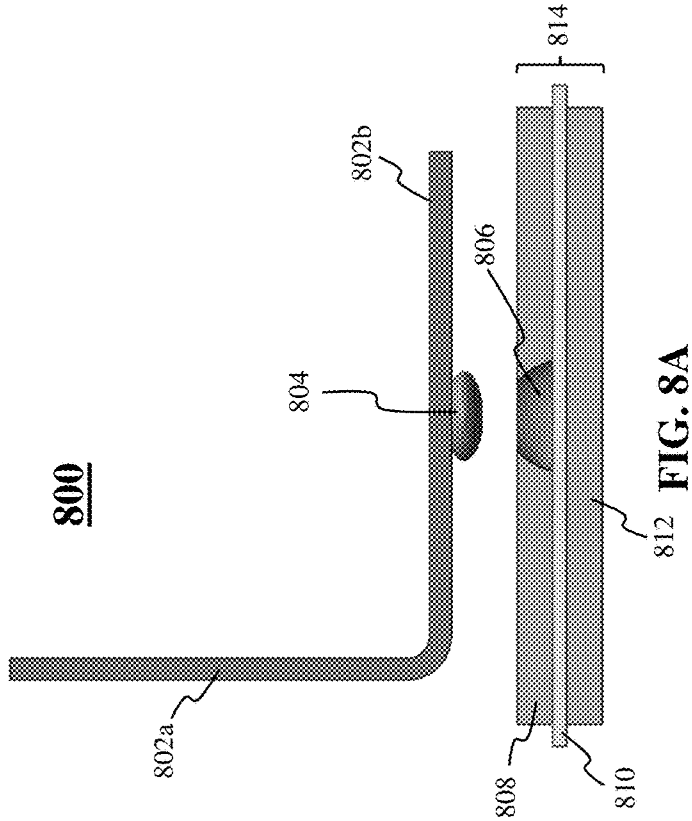
Figure 8C:
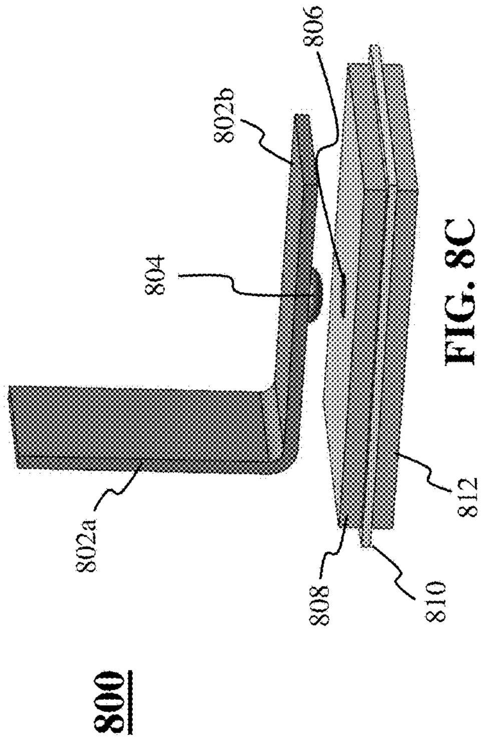

FIGS. 8A-8C are representative drawings of a pressure contact assembly 800, according to exemplary embodiments. FIGS. 8A-8B are side views and FIG. 8C is a perspective view of the pressure contact assembly 800. In exemplary embodiments, a power lead (terminal) has two portions 802*a* and 802*b* (collectively, "lead(s) 802"), with lead portion 802*a* being orthogonal to lead portion 802*b*, forming an "L shape". The lead 802 is to be attached to a power substrate 814 consisting of a first surface 808 and a second surface 812, with a ceramic tile 810 sandwiched therebetween. Once attached, lead portion 802*a* is orthogonal to the power substrate 814 while lead portion 802*b* is adjacent the power substrate 814. In exemplary embodiments, the modification to the otherwise smooth surface of the lead portion 802*b* is a button 804 for attachment to the power substrate 814. The button 804 is an addition to the lead portion 802*b*. In exemplary embodiments, the button 804 is a copper stud that is attached to a bottom surface of the lead portion 802*b*, such as by laser welding.

In exemplary embodiments, an over-etch 806 is cut into the power substrate 814, specifically, the first surface 808. The over-etch 806 is cut through the first surface 808 until the ceramic tile 810 is visible. Further, the over-etch 806 is wider at the bottom than at the top of the first surface 808. In exemplary embodiments, the lead 802 is placed over the power substrate 814 until the button 804 is disposed over the over-etch 806. Pressure is applied to the lead portion 802*b* until the button 804 fits into the over-etch 806. Alternatively, the button 804 may be slid into the over-etch 806, from the back of the power substrate 814 or from the front. The first surface 808 will deform somewhat around the button 804, causing the lead 802 to be permanently attached to the power substrate 814 without using solder. The lead 802 is thus fastened to the power substrate 814.

Figures 9A, 9B, 9C:
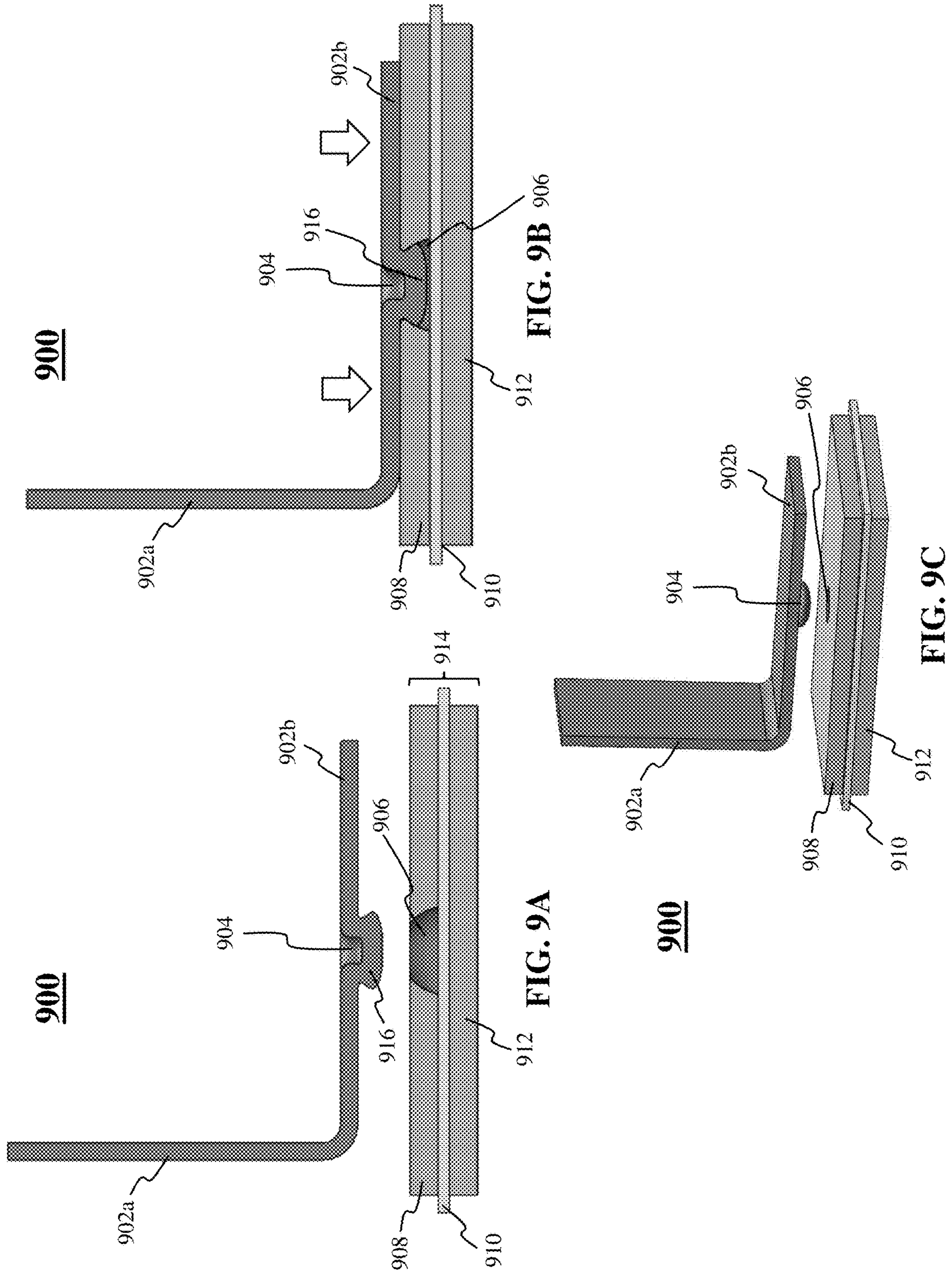
FIGS. 9A-9C are diagrams of a pressure contact assembly, in accordance with exemplary embodiments.

FIGS. 9A-9C are representative drawings of a pressure contact assembly 900, according to exemplary embodiment. FIGS. 9A-9B are side views and FIG. 9C is a perspective view of the pressure contact assembly 900. In exemplary embodiments, a power lead (terminal) has two portions 902*a* and 902*b* (collectively, "lead(s) 902"), with lead portion 902*a* being orthogonal to lead portion 902*b*, forming an "L shape". The lead 902 is to be attached to a power substrate 914 consisting of a first surface 908 and a second surface 912, with a ceramic tile 910 sandwiched therebetween. Once attached, lead portion 902*a* is orthogonal to the power substrate 914 while lead portion 902*b* is adjacent the power substrate 914. In exemplary embodiments, the modification to the otherwise smooth surface of the lead portion 902*b* is a deformation 904 in the top of the lead portion 902*b*, which causes a protrusion 916 beneath the lead portion 902*b*, where the protrusion 916 is for attachment to the power substrate 914. The deformation 904 and protrusion 916 are extensions of the lead portion 902*b*, which are achieved, in some embodiments, by coining, embossing, or blanking.

In exemplary embodiments, an over-etch 906 is cut into the power substrate 914, specifically, the first surface 908. The over-etch 906 is cut through the first surface 908 until the ceramic tile 910 is visible. Further, the over-etch 906 is wider at the bottom than at the top of the first surface 908. In exemplary embodiments, the lead 902 is placed over the power substrate 914 until the deformation 904 and protrusion 916 are disposed over the over-etch 906. Pressure is applied to the lead portion 902*b* until the protrusion 916 fits into the over-etch 906. Alternatively, the protrusion 916 may be slid into the over-etch 906, from the back of the power substrate 914 or from the front. The first surface 908 will deform somewhat around the protrusion 916, causing the lead 902 to be permanently attached to the power substrate 914 without using solder. The lead 902 is thus fastened to the power substrate 914.

Figure 10A:
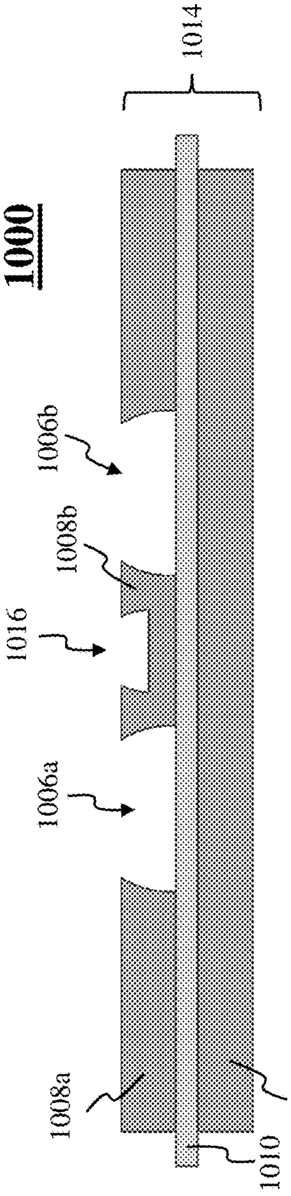
FIGS. 10A-10D are diagrams of a pressure contact assembly, in accordance with exemplary embodiments.
Figure 10B:
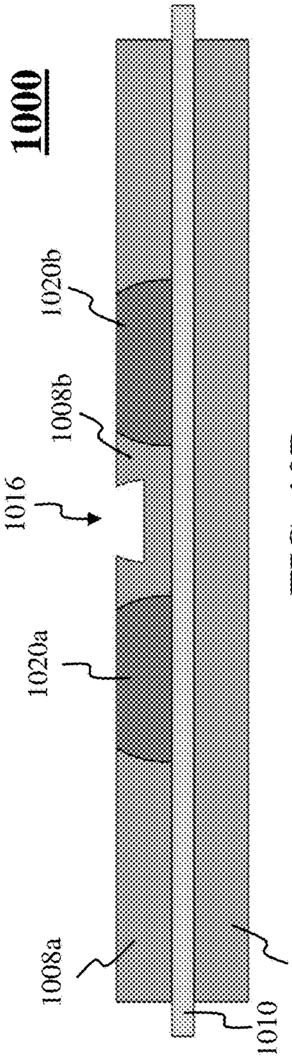
Figure 10C:
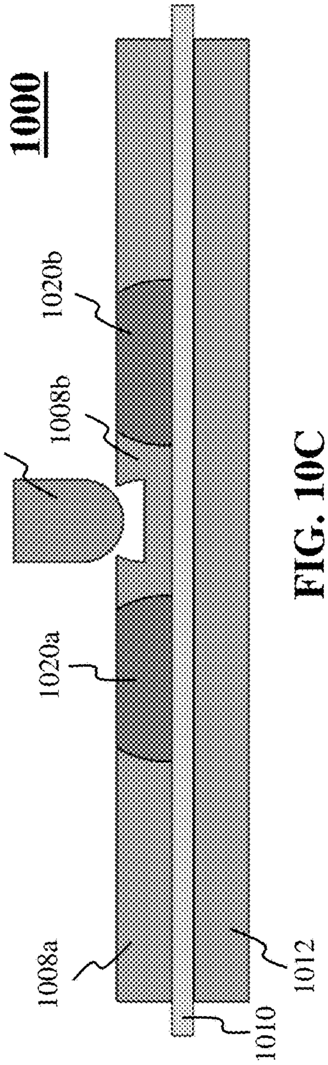
Figure 10D:
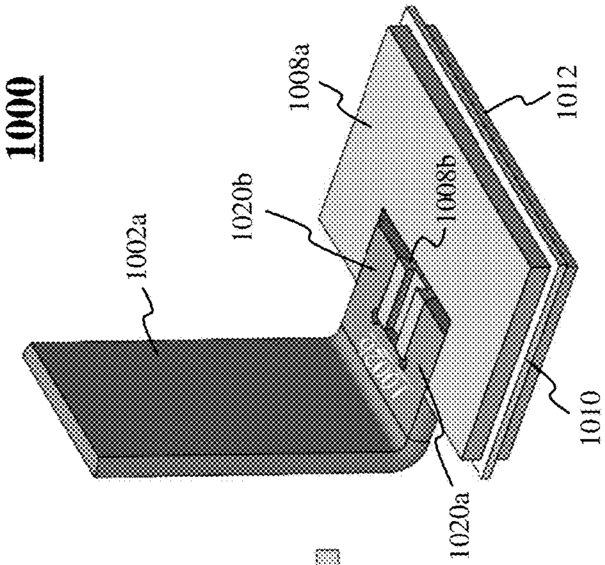

FIGS. 10A-10D are representative drawings of a pressure contact assembly 1000, according to exemplary embodiments. FIGS. 10A-10C are side views while FIG. 10D is a perspective view of the pressure contact assembly 1000. In exemplary embodiments, a power lead (terminal) has two portions 1002*a* and 1002*b* (collectively, "lead(s) 1002"), with lead portion 1002*a* being orthogonal to lead portion 1002*b*, forming an "L shape". The lead 1002 is to be attached to a power substrate 1014 consisting of a first surface consisting of two portions 1008*a* and 1008*b* (collectively, "first surface 1008") and a second surface 1012, with a ceramic tile 1010 sandwiched therebetween. Once attached, lead portion 1002*a* is orthogonal to the power substrate 1014 while lead portion 1002*b* is adjacent the power substrate 1014. In exemplary embodiments, the modification to the otherwise smooth surface of the lead portion 1002*b* is the cutting away of a center portion (center cut) of the lead portion 1002*b*, resulting in a pair of "feet" 1020*a* and 1020*b* (singularly, "foot 1020", collectively, "feet 1020") that are used to attach the lead 1002 to the power substrate 1014.

In exemplary embodiments, over-etches 1006*a* and 1006*b* (collectively, "over-etch(es) 1006") are cut into the power substrate 1014, specifically, the first surface 1008. The over-etches 1006 are cut through the first surface 1008 until the ceramic tile 1010 is visible. Further, the over-etches 1006 are wider at the bottom than at the top of the first surface 1008. In exemplary embodiments, the feet 1020 of the lead 1002 are slid into the power substrate 1014 until the foot 1020*a* fits into over-etch 1006*a* and foot 1020*b* fits into over-etch 1006*b*.

The first surface 1008 of the power substrate 1014 has two parts, a first portion 1008*a* and a second portion 1008*b*. In exemplary embodiments, between the two over-etches 1006*a* and 1006*b* is an under-etch 1016. The under-etch 1016 is defined herein as a cut into the first surface 1008 that does not reach the ceramic tile 1010 below. In this example, the under-etch 1016 is cut into the second portion 1008*b* of the first surface. In contrast to the over-etches 1006*a* and 1006*b*, the under-etch 1016 is not cut all the way to the ceramic tile 1010. A pressure device 1018 is shown, which could be a part of the housing of the pressure contact assembly 1000. By applying pressure to the under-etch 1016, the second portion 1008*b* will deform somewhat around the two feet 1020 of the lead 1002, causing the lead 1002 to be permanently attached to the power substrate 1014 without using solder. In exemplary embodiments, as feet 1020*a* and 1020*b* are slid into respective over-etches 1006*a* and 1006*b*, mechanical pressure may be applied to the under-etch 1016 which deforms the second portion 1008*b* of the first surface 1008, resulting in a tight coupling of between the lead 1002 and the power substrate 1014.

Figure 11A:
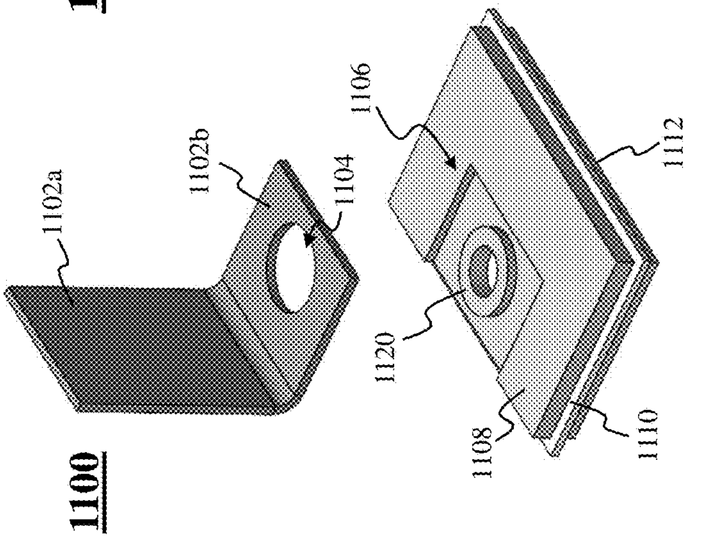
FIGS. 11A-11D are diagrams of a pressure contact assembly, in accordance with exemplary embodiments.
Figure 11B:
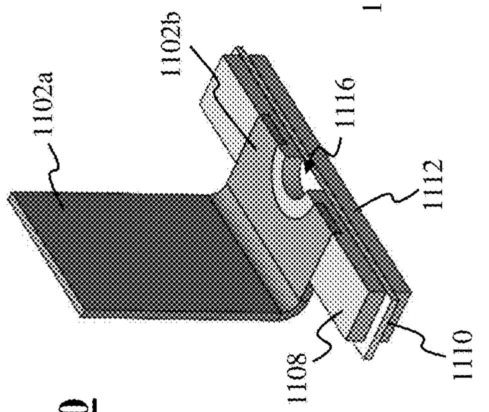
Figure 11C:
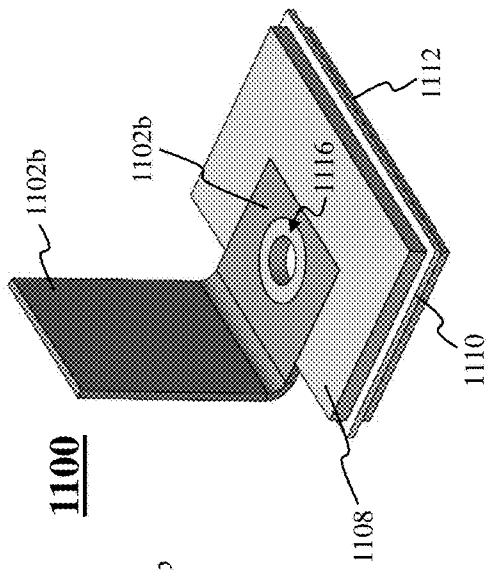
Figure 11D:
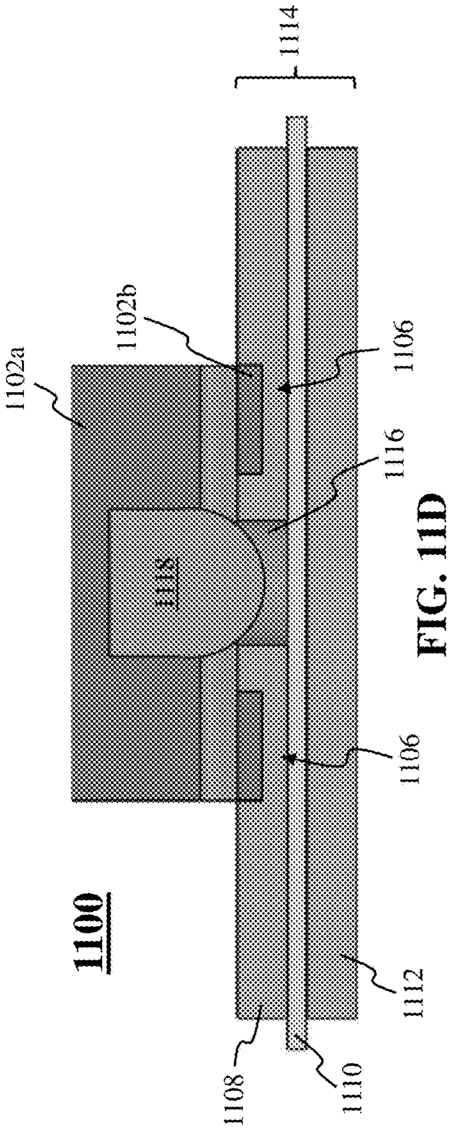

FIGS. 11A-11D are representative drawings of a pressure contact assembly 1100, according to exemplary embodiments. FIGS. 11A-11C are perspective views and FIG. 11D is a side view of the pressure contact assembly 1100. In exemplary embodiments, a power lead (terminal) has two portions 1102*a* and 1102*b* (collectively, "lead(s) 1102"), with lead portion 1102*a* being orthogonal to lead portion 1102*b*, forming an "L shape". The lead 1102 is to be attached to a power substrate 1114 consisting of a first surface 1108 and a second surface 1112, with a ceramic tile 1110 sandwiched therebetween. Once attached, lead portion 1102*a* is orthogonal to the power substrate 1114 while lead portion 1102*b* is adjacent the power substrate 1114. In exemplary embodiments, lead portion 1102*b* is the portion of the lead 1102 being attached to the power substrate 1114. In exemplary embodiments, the modification to the otherwise smooth surface of the lead portion 1102*b* is an aperture 1104 cut through the lead portion 1102*b*.

In exemplary embodiments, an under-etch 1106 and an over-etch 1116 are cut into the power substrate 1114, specifically, the first surface 1108. In some embodiments, the under-etch 1116 is a half-etch, meaning that half of the first surface 1108 is etched away. The under-etch 1106 is a rectangular cutout of the first surface 1108 that is not cut all the way to the ceramic tile 1110, while the over-etch 1116 is cut through the first surface 1108 until the ceramic tile 1110 is visible. In a non-limiting example, the under-etch 1106 is rectangular while the over-etch 1116 is circular. Further, there is a circular portion 1120 of the first surface 1108 that is not etched between the under-etch 1106 and the over-etch 1116. In exemplary embodiments, the circular portion 1120 is approximately the same diameter as the aperture 1104.

In exemplary embodiments, the lead 1102 is disposed over the power substrate 1114 until the aperture 1104 fits over the circular portion 1120. The dimension of the lead portion 1102*b* is approximately the same as the dimension of the under-etch 1106.

A pressure device 1118 is shown, which may be a part of the housing of the pressure contact assembly 1100. By applying pressure to the over-etch 1116, the circular portion 1120 will deform somewhat around the lead portion 1102*b*, causing the lead 1002 to be permanently attached to the power substrate 1114 without using solder. In exemplary embodiments, as lead portions 1102*b* is inserted into the into the under-etch 1106, mechanical pressure may be applied to the over-etch 1116 which deforms the circular portion 1120 of the first surface 1108, resulting in a tight coupling of between the lead 1102 and the power substrate 1114.

Table 1 provides a comparison between materials used in power substrates versus using the pressure contact assemblies (400, 500, 600, 700, 800, 900, 1000, and 1100). K88 is a leadframe manufacturer that uses copper and alloys to make the lead terminals both strong and flexible, resulting in a spring-like quality to the leads. Rthjc is the impedance from junction to case (outside surface of package). In exemplary embodiments, the leads for the above-described pressure contact assemblies 400, 500, 600, 700, 800, 900, 1000, and 1100 are impregnated with a material to make the leads springier yet maintain hardness. Where lead frames typically have a hardness vector (HV) of 100 to 130, in exemplary embodiments, the pressure contact assemblies 400, 500, 600, 700, 800, 900, 1000, and 1100. Further, in exemplary embodiments, where prior art power substrates typically used Aluminum Oxide ($Al_2O_3$), Aluminum Nitride (AlN), or Zirconia Toughened Alumina (ZTA), the pressure contact assemblies 400, 500, 600, 700, 800, 900, 1000, and 1100 utilize ceramic made of $Si_3N_4$(Silicon Nitride) for better performance rather than AlN.

TABLE 1

Comparison between prior art and new technology

| Prior art | Disclosed art | Advantage |
|---|---|---|
| Uses industry standard softer copper material like TAMACA, KFC, 12Sn, PMC90 | Uses K88 harder leadframe material (140~170 hardness value) or equivalent material due to pressured contact requirement when inserted into power substrate cavity | Sturdy leadframe, hard wearing |
| Uses standard substrate $Al_20_3$ or AlN DCB | Uses high-performance substrate, AMB $Si_3N_4$ | High current carrying capability; no ceramic crack issue due to high bending strength and toughness |

TABLE 1-continued

| Comparison between prior art and new technology | | |
|---|---|---|
| Prior art | Disclosed art | Advantage |
| Soldered power terminal | No solder connection | High reliability performance due to the absence of solder; high current carrying capability |
| Press fit pin to PCB | Pressured contact to DCB/AMB/IMS | Disclosed art is inside package while prior art is outside package |

In exemplary embodiments, the ceramic tile used for the power substrate in the pressure contact assemblies 400, 500, 600, 700, 800, 900, 1000, 1100 is modified from prior art power assemblies to enhance the strength of the power substrate. Table 2 provides characteristic data about the ceramic tile. In exemplary embodiments, thermal conductivity, bending strength, and fracture toughness are all considered when selecting the ceramic tile for the pressure contact assemblies 400, 500, 600, 700, 800, 900, 1000, 1100. In exemplary embodiments, the ceramic tiles are made using Silicon Nitride ($Si_3N_4$), also known as high-performance AMB substrate with a favorable combination to thermal conductivity, bending strength, and toughness, as compared to standard $Al_2O_3$, AlN, or ZTA. In addition, only AMB can achieve a thicker layer of copper to ceramic tile through brazing because, by "bonding process", the proven thickness of the copper layer is only 0.50 mm maximum, as compared to AMB of 0.8 mm, which is ideal for a solderless connection to form the cavity (e.g., cavity 422 in FIGS. 4A-4D) in the copper surface (e.g., first surface 408 of power substrate 414).

TABLE 2

| Characteristics of ceramic tile | | | | |
|---|---|---|---|---|
| | $Al_20_3$ 96% | AlN | ZTA (9%) | $Si_3N_4$ |
| Thermal conductivity (W/mK) | 24 | 180 | 28 | 90 |
| Bending strength (MPa) | 450 | 300 | 700 | 650 |
| Fracture toughness (MPa/√m) | 3, 8-4, 2 | 3-3, 4 | 4, 5-5 | 6, 5-7 |

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations, and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A pressure contact assembly comprising:

a power substrate comprising a first surface coupled to a ceramic tile, wherein the first surface comprises a cavity;

a chip soldered onto the first surface; and a lead to be inserted into the cavity, the lead comprising:

a top portion to connect to an external device; and a bottom portion to fit into the cavity, wherein the top portion of the lead is split into:

a first s-shaped section;

a second s-shaped section; and a third s-shaped section, wherein the second s-shaped section is disposed between the first s-shaped section and the third s-shaped section, and wherein the second s-shaped section is a mirror image of the first s-shaped section and the third s-shaped section.

2. The pressure contact assembly of claim 1, wherein the first s-shaped section and the third s-shaped section move horizontally in one direction while the second s-shaped section moves horizontally in a second, opposite direction.

3. The pressure contact assembly of claim 2, wherein the bottom portion is resistance welded to the first surface.

4. The pressure contact assembly of claim 1, wherein the ceramic tile is visible at the cavity.

5. The pressure contact assembly of claim 1, further comprising a second surface, wherein the ceramic tile is sandwiched between the first surface and the second surface.

6. The pressure contact assembly of claim 5, wherein the power substrate is a direct copper bonded substrate.

7. The pressure contact assembly of claim 5, wherein the power substrate is an active metal brazed substrate.

8. The pressure contact assembly of claim 1, wherein the power substrate is an insulated metal substrate.

* * * * *